(12) United States Patent
Zundel (10) Patent No.: US 9,899,509 B2
(45) Date of Patent: Feb. 20, 2018

(54) SEMICONDUCTOR DEVICE COMPRISING AUXILIARY TRENCH STRUCTURES AND INTEGRATED CIRCUIT

(71) Applicant: Infineon Technologies AG, Neubiberg (DE)

(72) Inventor: Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/082,668

(22) Filed: Mar. 28, 2016

(65) Prior Publication Data
US 2016/0293752 A1    Oct. 6, 2016

(30) Foreign Application Priority Data
Mar. 31, 2015  (DE) .................. 10 2015 105 005

(51) Int. Cl.
*H01L 29/78*      (2006.01)
*H01L 29/40*      (2006.01)
*H01L 29/66*      (2006.01)
*H01L 29/06*      (2006.01)

(52) U.S. Cl.
CPC ...... *H01L 29/7811* (2013.01); *H01L 29/0696* (2013.01); *H01L 29/407* (2013.01); *H01L 29/66734* (2013.01); *H01L 29/7813* (2013.01); *H01L 29/0615* (2013.01); *H01L 29/0619* (2013.01); *H01L 29/402* (2013.01)

(58) Field of Classification Search
CPC ............... H01L 29/7813; H01L 29/407; H01L 29/66734; H01L 29/7811
See application file for complete search history.

(56) References Cited

U.S. PATENT DOCUMENTS

| 7,868,363 | B2 | 1/2011 | Zundel |
| 8,487,372 | B1 | 7/2013 | Hsieh |
| 2010/0207206 | A1* | 8/2010 | Krischke ............ H01L 29/0642 257/337 |
| 2011/0254086 | A1* | 10/2011 | Hsieh ............ H01L 21/823481 257/330 |

(Continued)

FOREIGN PATENT DOCUMENTS

DE         10127885 A1   12/2002

OTHER PUBLICATIONS

Office Action communication of the German Patent and Trademark Office for Appln. Ser. No. 102015105005.6, Nov. 13, 2015.

*Primary Examiner* — Julia Slutsker
(74) *Attorney, Agent, or Firm* — Baker Botts L.L.P.

(57) ABSTRACT

An embodiment of a semiconductor device comprises a trench transistor cell array in a semiconductor body. The semiconductor device further comprises an edge termination region of the trench transistor cell array. At least two first auxiliary trench structures extend into the semiconductor body from a first side and are consecutively arranged along a lateral direction. The edge termination region is arranged, along the lateral direction, between the trench transistor cell array and the at least two first auxiliary trench structures. First auxiliary electrodes in the at least two first auxiliary trench structures are electrically connected together and electrically decoupled from electrodes in trenches of the trench transistor cell array.

16 Claims, 9 Drawing Sheets

(56) References Cited

U.S. PATENT DOCUMENTS

2013/0037906 A1\* 2/2013 Hirler ................... H01L 21/761
                                                                                257/506
2014/0353748 A1\* 12/2014 Ma ...................... H01L 29/0634
                                                                                257/334

\* cited by examiner

SEMICONDUCTOR DEVICE COMPRISING AUXILIARY TRENCH STRUCTURES AND INTEGRATED CIRCUIT

CROSS-REFERENCE TO RELATED APPLICATION

This application claims priority to German Application Serial No. 102015105005.6 filed Mar. 31, 2015 and entitled "Semiconductor Device Comprising Auxiliary Trench Structures and Integrated Circuit".

BACKGROUND

Processing of trench semiconductor devices such as power trench field effect transistors (power FETs) may include chemical mechanical polishing (CMP) processes for improving precision of etching back electrode material such as polycrystalline silicon in trenches. Distribution of trenches over a chip area may have an impact on device parameters caused by semiconductor processing. By way of example, edge or transition regions may result in device behavior different from areas in a center of a trench transistor cell area. It is an object to provide a semiconductor device and an integrated circuit having an improved stability of device parameters with regard to manufacturing processes.

SUMMARY

According to an embodiment, a semiconductor device comprises a trench transistor cell array in a semiconductor body. The semiconductor device further comprises an edge termination region of the trench transistor cell array. At least two first auxiliary trench structures extend into the semiconductor body from a first side and are consecutively arranged along a lateral direction. The edge termination region is arranged, along the lateral direction, between the trench transistor cell array and the at least two first auxiliary trench structures.

First auxiliary electrodes in the at least two first auxiliary trench structures are electrically connected together and electrically decoupled from electrodes in trenches of the trench transistor cell array.

According to another embodiment, an integrated circuit comprises a sensor device including a wiring in a sensor trench structure extending into a semiconductor body from a first side. A first auxiliary trench structure extends into the semiconductor body from the first side. The sensor trench structure and the first auxiliary trench structure are arranged directly one after another along a lateral direction. An electrode in the first auxiliary trench structure is electrically decoupled from the wiring in the sensor trench structure.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

The semiconductor device may have terminal contacts such as contact pads (or electrodes) which allow electrical contact to be made with the integrated circuits or secrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), PVD (physical vapor deposition), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. In particular, stealth dicing, which is a specific technique using laser dicing may be applied. Stealth dicing allows suppressing cutting waste and is therefore a suitable process for cutting work pieces that are vulnerable to contamination. Further, it is a dry process that does not require cleaning, and is therefore also suitable for processing sensitive structures such as, e.g., MEMS, that are vulnerable to load. Further benefits which may be achieved by the stealth dicing technology are high-speed dicing, superior breakage strength, small kerf and low running costs.

In stealth dicing technology, a laser beam of a wavelength capable of transmitting through the semiconductor wafer is focused onto a point inside the semiconductor wafer. Due to a non-linear absorption effect, only localized points inside the semiconductor wafer may be selectively laser-machined, whereby damaging of the front and back surface of the semiconductor wafer may be avoided. The semiconductor wafer can be diced by moving the relative positions of the laser beam and the semiconductor wafer in order to scan the semiconductor wafer according to the desired dicing pattern.

The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

Figure 1:
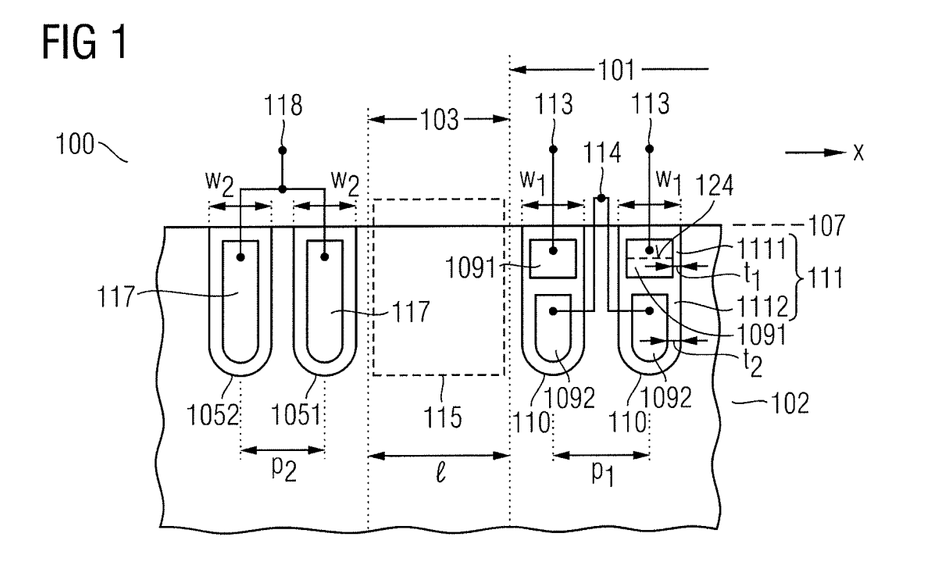
FIG. 1 is a schematic cross-sectional view of a semiconductor device including a trench transistor cell array, an edge termination region and at least two first auxiliary trench structures.

An embodiment of a semiconductor device 100 is illustrated in the schematic cross-sectional view of FIG. 1.

The semiconductor device 100 includes a trench transistor cell array 101 in a semiconductor body 102. The semiconductor device 100 further includes an edge termination region 103 of the trench transistor cell array 101. At least two first auxiliary trench structures 1051, 1052 extend into the semiconductor body 102 from a first side 107 and are consecutively arranged along a lateral direction x. The edge termination region 103 is arranged, along the lateral direction x, between the trench transistor cell array 101 and the at least two first auxiliary trench structures 1051, 1052. First auxiliary electrodes 117 in the at least two first auxiliary trench structures 1051, 1052 are electrically connected together and electrically decoupled from electrodes in trenches of the trench transistor cell array.

In the embodiment illustrated in FIG. 1, the electrodes in the trench transistor cell array 101 include a gate electrode 1091 and a field electrode 1092 in a gate trench 110. According to other embodiments, no field electrode may be present in the gate trench 110 or even more than one field electrode, for example two, three, four or even more field electrodes may be present in the gate trench 110. According to yet another embodiment, gate and field electrodes may also be arranged in different trench structures in the trench transistor cell array 101.

A gate dielectric 1111 of a dielectric structure 111 is sandwiched, along the lateral direction x, between the gate electrode 1091 and a corresponding part of the semiconductor body 102 surrounding the gate trench 110.

A field dielectric 1112 of the dielectric structure 111 is sandwiched, along the lateral direction x, between the field electrode 1092 and a corresponding part of the semiconductor body 102 surrounding the gate trench 110.

A thickness t1 of the gate dielectric 1111 is smaller than a thickness t2 of the field dielectric 1112. According to an embodiment, the thickness t1 of the gate dielectric 1111 ranges between 5 nm to 80 nm. Exemplary materials for the gate dielectric 1111 include one or more, for examples layer stacks of oxide(s), for example thermal oxide(s), nitride(s), high-k dielectric(s) and low-k dielectric(s). According to another embodiment, the thickness t2 of the field dielectric 1112 ranges between 50 nm to 1 µm. Exemplary materials for the field dielectric 1112 may be made by one or more, for example a layer stack of oxide(s), for example deposited oxide(s) such as chemical vapor deposition (CVD) oxide(s), nitride(s), high-k dielectric(s) and low-k dielectric(s).

The gate electrode 1091 is electrically connected to a gate electrode terminal 113, for example a gate pad or a gate electrode contact. The field electrode 1092 is electrically connected to a field electrode terminal 114. The field electrode terminal 114 may be electrically disconnected from the gate electrode terminal 113. According to an embodiment, the field electrode terminal 114 is electrically connected to a source terminal of the trench transistor cell array 101 or to a reference voltage terminal corresponding to a voltage ranging between a voltage of the source terminal and a voltage of a drain terminal of the trench transistor cell array 101.

A box 115 in the edge termination region 103 encompasses any kind of junction termination structure suitable for the trench transistor cell array 101. A type of the junction termination structure may depend on a voltage class of transistors in the trench transistor cell array 101. In transistors of different voltage classes such as transistors of a low-voltage class, transistors of a medium-voltage class or transistors of a high-voltage class different types of edge termination structures, for example edge termination trench structures, planar edge termination structures such as floating ring structures, junction termination extension (JTE) structures, variation of lateral doping (VLD) structures and field plate structures may be employed.

According to an embodiment, an extension l of the edge termination region 103 along the lateral direction x between the trench transistor cell array 101 and the at least two first auxiliary trench structures 1051, 1052 is in a range between 5 µm and 500 µm. Values of l in a lower part of the range may correspond to low-voltage trench transistor cell arrays, whereas values of l in an upper part of the range may correspond to high-voltage trench transistor cell arrays, for example.

According to an embodiment, a pitch p1 between adjacent gate trenches 110 along the lateral direction x equals a pitch p2 between adjacent first auxiliary trench structures, e.g. between the at least two first auxiliary trench structures 1051, 1052. According to another embodiment, the pitch p1 between adjacent gate trenches 110 along the lateral direction x and the pitch p2 between first auxiliary trench structures, e.g. between the first auxiliary trench structures 1051, 1052 satisfy $0.2 \times p1 < p2 < 2.5 \times p1$.

According to another embodiment, a width w1 of the gate trenches 110 along the lateral direction x at the first side 107 equals a width w2 of the at least two first auxiliary trench structures at the first side 107, e.g. the first auxiliary trench structures 1051, 1052. According to another embodiment, the width w1 of the gate trenches 110 along the lateral direction x at the first side 107 and the width w2 of the at least two first auxiliary trench structures at the first side 107, e.g. the first auxiliary trench structures 1051, 1052 satisfy $0.5 \times w1 < w2 < 2 \times w1$.

According to the embodiment illustrated in FIG. 1, each one of the at least two first auxiliary trench structures 1051, 1052 includes a single first auxiliary electrode 117. The first auxiliary electrode 117 is electrically connected to a first auxiliary electrode terminal 118 electrically decoupled from the gate electrode terminal 113 and from the field electrode terminal 114 of the trench transistor cell array 101.

The at least two first auxiliary trench structures 1051, 1052 may lead to the technical benefit of reliability improvement of trench semiconductor devices that may be caused by trench processing and chemical mechanical polishing, for example.

Figure 2:
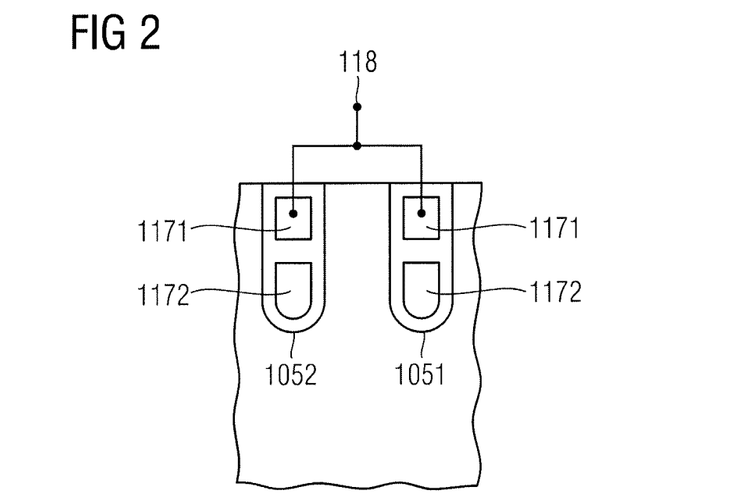
FIG. 2 is a schematic cross-sectional view of one embodiment of an electrode arrangement in the at least two first auxiliary trench structures.

According to another embodiment illustrated in the schematic cross-sectional view of FIG. 2, each one of the at least two first auxiliary trench structures 1051, 1052 includes at least two, i.e. more than one, first auxiliary electrodes 1171, 1172. Apart from two first auxiliary electrodes in each one of the at least two first auxiliary trench structures 1051, 1052 as is illustrated in FIG. 2, more than two, for example three, four, five or even more than five first auxiliary electrodes may be arranged in each first auxiliary trench structure. According to an embodiment, the first auxiliary electrodes 1172 are electrically disconnected from the first auxiliary electrodes 1171. According to yet another embodiment, the first auxiliary electrodes 1172 are electrically connected to the first auxiliary electrodes 1171.

Figure 3:
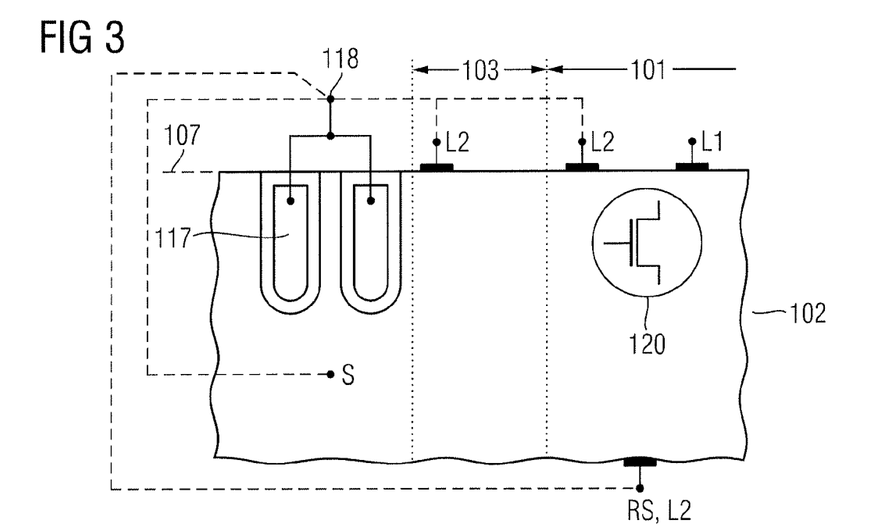
FIG. 3 is a schematic cross-sectional view of the semiconductor device of FIG. 1 for illustrating embodiments of electrical connections of a first auxiliary electrode in the first auxiliary trench structure.

Embodiments of connections of the first auxiliary electrode terminal 118 are schematically illustrated in the cross-sectional view of the semiconductor body 102 illustrated in FIG. 3.

The embodiments of connections of the first auxiliary electrode terminal 118 to other terminals are illustrated in a simplified manner by dashed lines. A field effect transistor (FET) symbol 120 in the trench transistor cell array 101 encompasses any kind of trench transistor concepts formed in the respective part of the semiconductor body 102, for example lateral transistor concepts such as FinFETs having first and second load terminals L1, L2, i.e. source and drain terminals at the first side 107 of the semiconductor body 102 as well as vertical trench transistor concepts having first and second load terminals L1, L2, i.e. source and drain terminals at opposite sides of the semiconductor body 102. In case of a vertical trench transistor concept the second load terminal L2 may also be placed at a lateral end of the edge termination region where a contact to the semiconductor body 102 at the first side 107 corresponds to a drain voltage at the second side opposite to the first side 107 due to a lateral voltage reduction by the junction termination structure in the edge termination region 103.

According to an embodiment, the first auxiliary electrode terminal 118 is electrically connected to a drain terminal, for example the load terminal L2 at the first side 107 in case of a lateral trench transistor concept or the load terminal L2 at a second side opposite to the first side 107.

According to another embodiment, the first auxiliary electrode terminal 118 is electrically connected to a substrate terminal S, the substrate terminal S providing an electrical connection to a semiconductor substrate of the semiconductor body 102, for example an electrical connection to a highly p-doped or to a highly n-doped semiconductor substrate.

According to another embodiment, the first auxiliary electrode terminal 118 is electrically connected to a rear side contact RS at the second side of the semiconductor body 102 opposite to the first side 107. The rear side contact RS may correspond to a drain contact of a vertical trench transistor having source and gate terminals connected at the first side 107.

Examples of junction termination structures in the box 115 of the edge termination region 103 are illustrated in the cross-sectional views of FIGS. 4A to 4D.

Figure 4A:
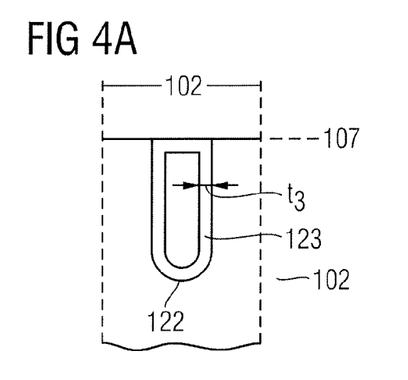
FIG. 4A is a schematic cross-sectional view of an edge termination trench structure being one embodiment of a junction termination structure in the edge termination region of FIG. 1.

According to the embodiment illustrated in the schematic cross-sectional view of the semiconductor body 102 in FIG. 4A, the edge termination region 103 includes an edge termination trench structure 122. A thickness t3 of a dielectric 123 in the edge termination trench structure 122 is greater than a thickness t1 of the gate dielectric 1111 in the trench transistor cell array 101 at a vertical level 124 of a center of the gate electrode 1111 in the gate trench 110. According to an embodiment, the dielectric 123 in the edge termination trench structure 122 and the field dielectric 1112 may be formed together. The dielectric 123 may line sidewalls of the edge termination trench structure 122, whereas in a corresponding part of the gate trench 110, the field dielectric 1112 is replaced by the comparatively thinner gate dielectric 1111 in an upper part of the gate trench 110.

Figure 4B:
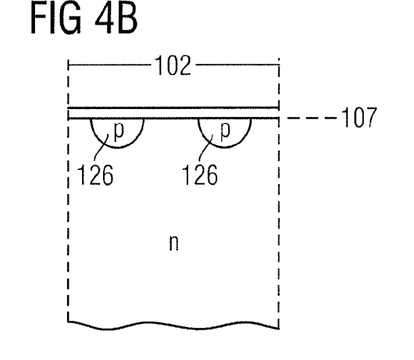
FIG. 4B is a schematic cross-sectional view of a floating guard ring structure being one embodiment of a junction termination structure in the edge termination region of FIG. 1.

According to the embodiment illustrated in the schematic cross-sectional view of the semiconductor body 102 in FIG. 4B, the edge termination region 103 includes floating p-doped rings in an n-doped semiconductor body 102, the floating p-doped rings adjoining a dielectric or passivation layer at the first side 107.

Figure 4C:
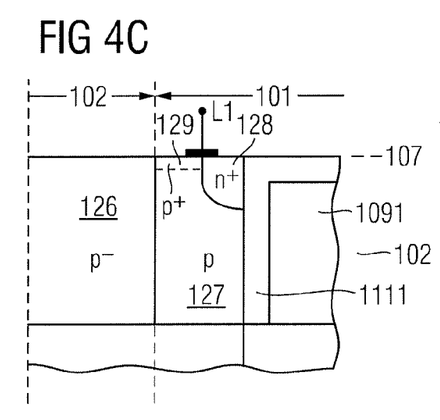
FIG. 4C is a schematic cross-sectional view of a junction termination extension (JTE) structure being one embodiment of a junction termination structure in the edge termination region of FIG. 1.

According to the embodiment illustrated in the schematic cross-sectional view of the semiconductor body 102 in FIG. 4C, the edge termination region 103 includes a JTE structure having a p$^-$-doped region 126 having a smaller doping concentration than a p-doped body region 127 in the trench transistor cell array 101. An n$^+$-doped source region adjoins the first side 107. A source contact to the n$^+$-doped source region 128 and the body region 127 is illustrated in FIG. 4C by the first load terminal L1. An optional p$^+$-doped body contact region may be arranged between the first load terminal L1 and the body region 127 for improving an electrical contact. The source contact may be any kind of contact suitable to electrically connect the source and body regions 128, 127, e.g. a planar contact on the semiconductor body 102 at the first side 107 or a contact in a contact groove extending into the semiconductor body 102 at the first side 107 and providing an electrical connection through bottom and lateral surfaces.

According to an embodiment, the source region 128 and the source contact are absent in a semiconductor region between the at least two first auxiliary trench structures 1051, 1052 illustrated in FIGS. 1 to 3. Likewise, the source region 128 and the source contact may be absent in the edge termination region 103.

Figure 4D:
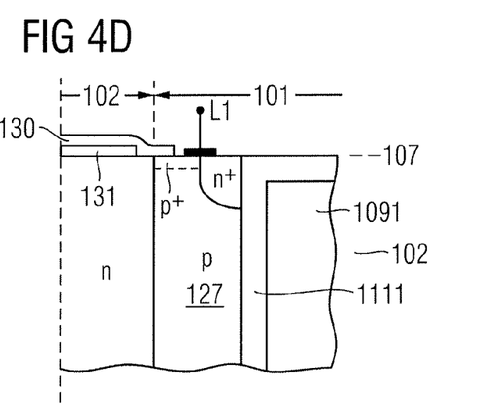
FIG. 4D is a schematic cross-sectional view of a field plate structure being one embodiment of a junction termination structure in the edge termination region of FIG. 1.

According to the embodiment illustrated in the schematic cross-sectional view of the semiconductor body 102 in FIG. 4D, the edge termination region 103 includes a field plate structure. The field plate structure includes a field plate 130, for example a conductive material or a stack of conductive materials such as metal(s) and/or highly doped semiconductor material(s) and a dielectric layer 131 between the field plate 130 and the semiconductor body 102.

Figure 5:
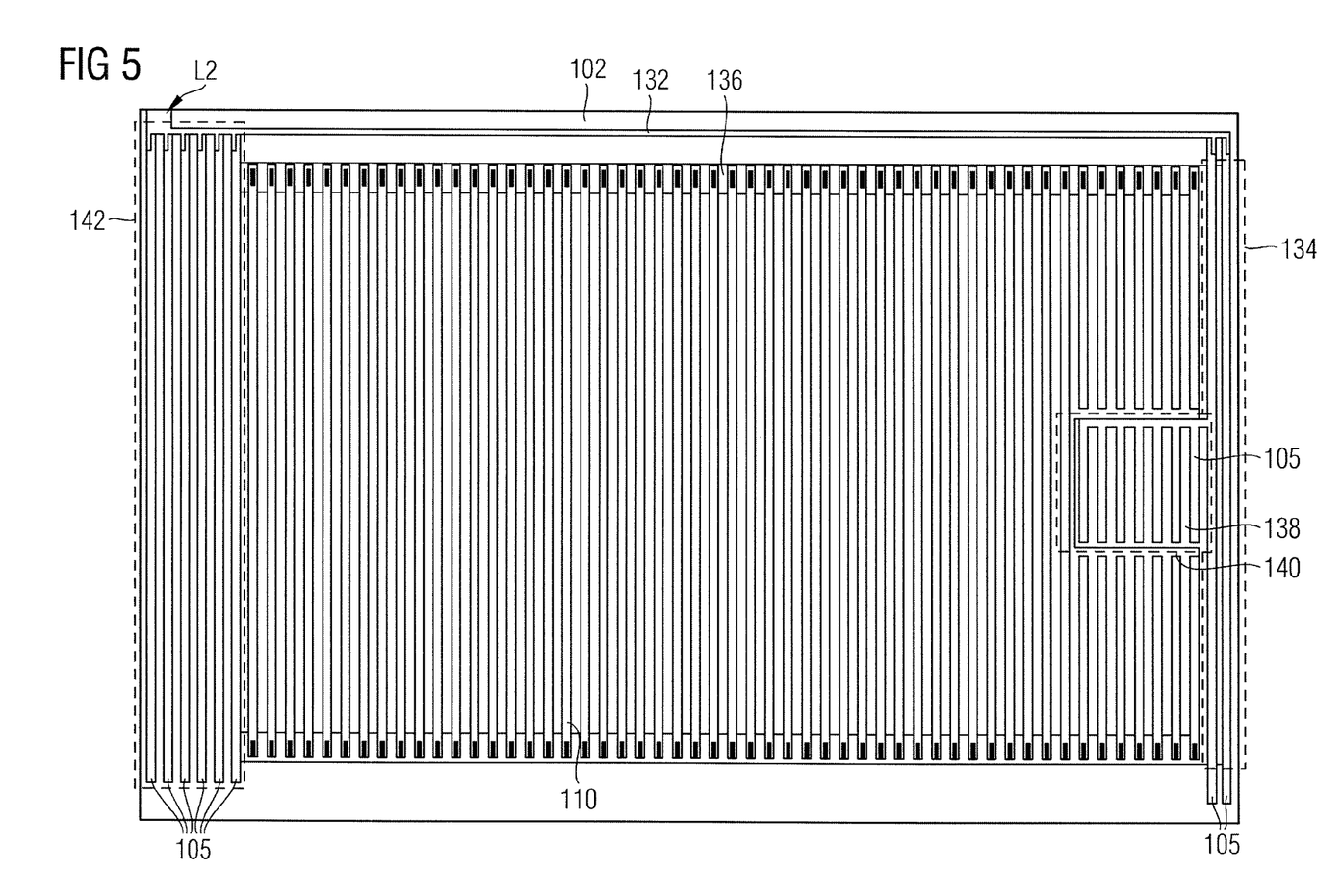
FIG. 5 is a schematic plan view of one embodiment of a semiconductor device including at least two first auxiliary trench structures.

FIG. 5 is a schematic plan view of one embodiment of a semiconductor device 200 including auxiliary trench structures.

Figure 6:
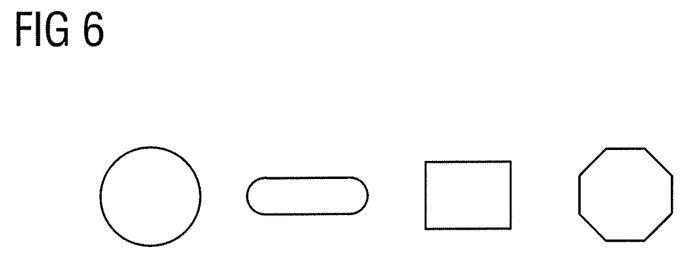
FIG. 6 are schematic plan views of trench structure geometries for illustrating embodiments of trench geometries for gate trenches and auxiliary trench structures.

According to the embodiment illustrated in FIG. 5, a geometry or shape of the first auxiliary trench structures 105 projected to a surface area of the semiconductor body 102 at the first side equals the geometry of the gate trenches 110 in the transistor cell array. In the embodiment of FIG. 5, the illustrated geometry is stripe-shaped. According to other embodiments, geometries of the first auxiliary trench structures 105 projected to a surface area of the semiconductor body 102 at the first side and geometries of the gate trenches 110 include circular trenches, elliptical trenches, square trenches, polygonal trenches, for example hexagonal trenches (see FIG. 6).

First auxiliary electrodes 117 in the first auxiliary trench structures 105 are electrically connected to a drain contact illustrated as the second load terminal L2.

A wiring 132 electrically interconnects first auxiliary trench structures 105 in different parts of the semiconductor body 102.

The first auxiliary trench structures 105 may be arranged in any free space of the semiconductor body 102, for example in an overlap area 134 with a gate runner 136 interconnecting gate electrodes in the gate trenches 110 and a gate pad 138, or in an overlap area 140 with the gate pad 138, or in an edge area 142 of the semiconductor body 102.

Figure 7:
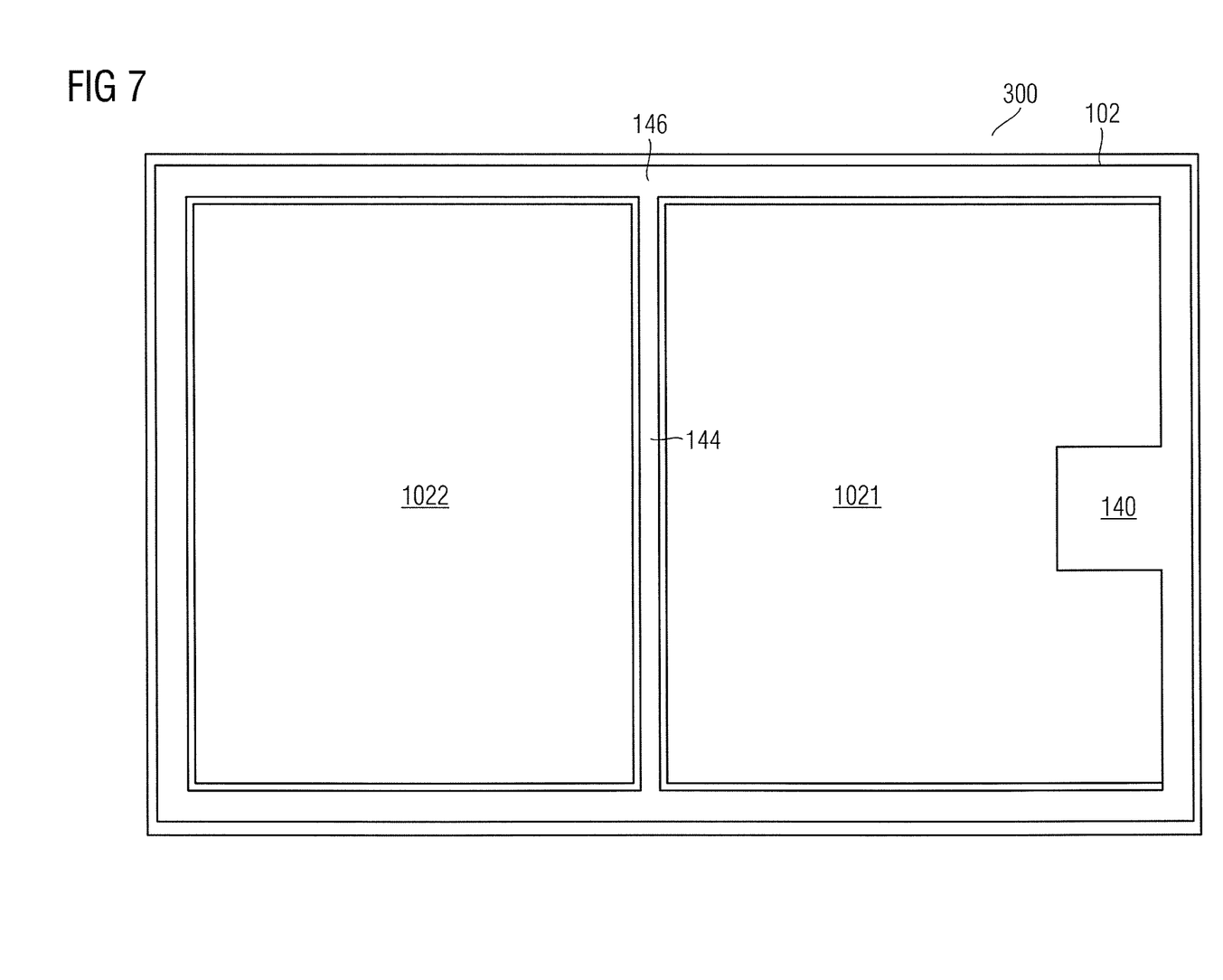
FIGS. 7 and 8 illustrate top views of embodiments of arrangement of auxiliary trench structures in a trench transistor device including first and second trench transistor cell arrays.
Figure 8:
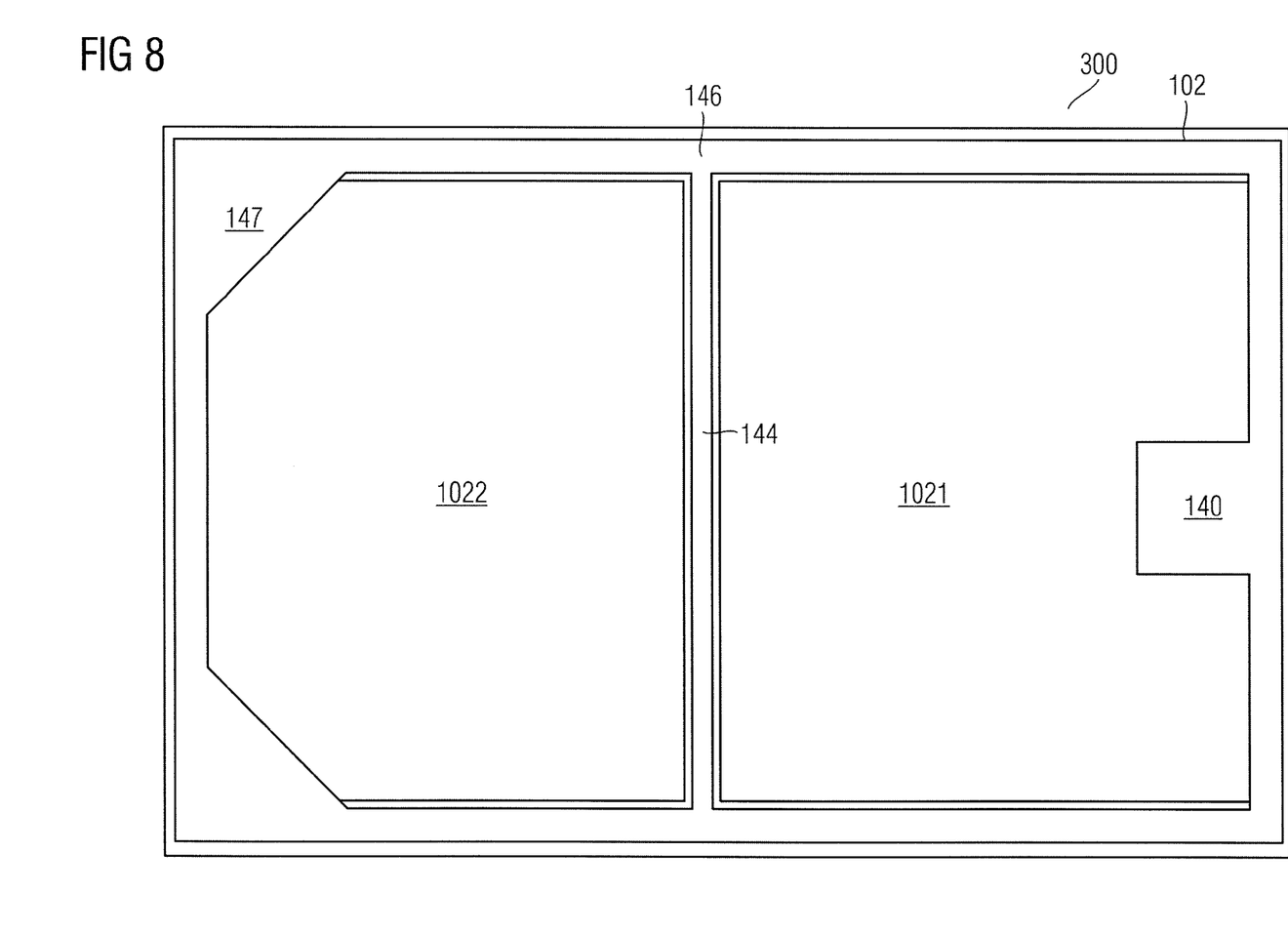

The schematic top views of FIGS. 7 and 8 illustrate embodiments of a semiconductor device 300 including first and second trench transistor cell arrays 1021, 1022. The first auxiliary trench structures 105 may be arranged in an intermediate area 144 between the between the first and second trench transistor cell arrays 1021, 1022. The first auxiliary trench structures 105 may alternatively or additionally be arranged in an edge area 146, including a chamfered corner area 147 surrounding the first and second trench transistor cell arrays 1021, 1022. The first auxiliary trench structures 105 may alternatively or additionally be arranged in the overlap area 140 with a gate pad, for example.

Figure 9:
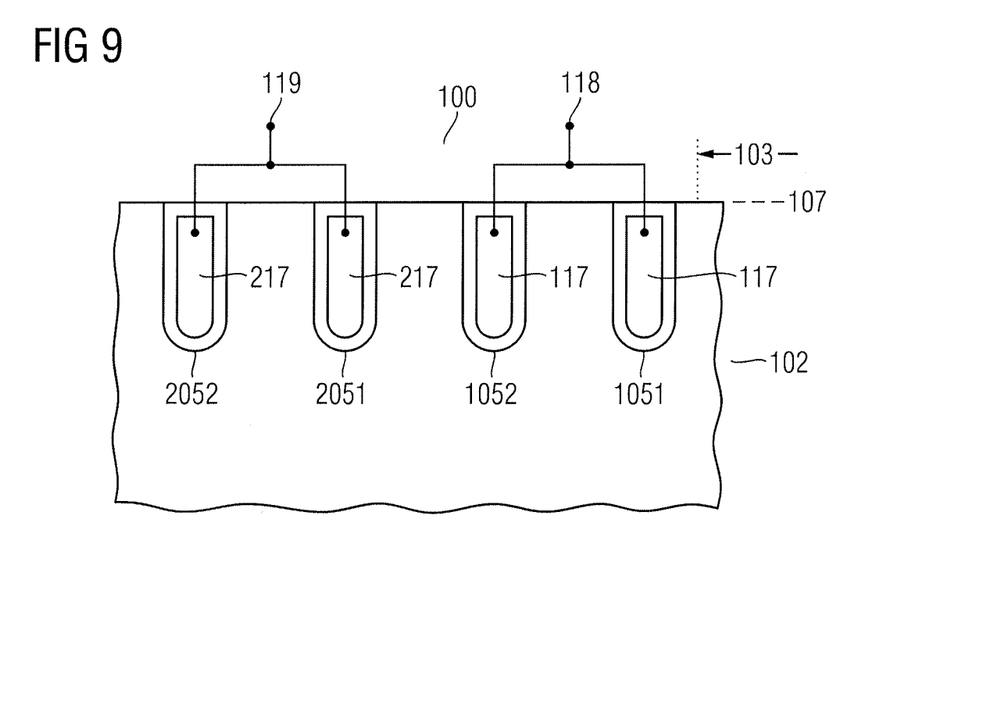
FIG. 9 is a schematic cross-sectional view of a semiconductor device including a trench transistor cell array, an edge termination region and at least two first and at least two second auxiliary trench structures.

The semiconductor device 100 according to the embodiment illustrated in the schematic cross-sectional view of FIG. 9 comprises at least two second auxiliary trench structures 2051, 2052 extending into the semiconductor body 102 from the first side 107 and being consecutively arranged along the lateral direction x.

The at least two first auxiliary trench structures 1051, 1052 are arranged, along the lateral direction x, between the at least two second auxiliary trench structures 2051, 2052 and the edge termination region 103.

Second auxiliary electrodes 217 in the at least two second auxiliary trench structures 2051, 2052 are electrically connected together and electrically decoupled from electrodes, for example the gate and field electrodes 1091, 1092 in trenches, for example the gate trenches 110 of the trench transistor cell array 101 and from the first auxiliary electrodes 117 in the at least two first auxiliary trench structures 1051, 1052.

The second auxiliary electrodes 217 may be electrically connected to a second auxiliary electrode terminal 119 electrically disconnected from the first auxiliary electrode terminal 118.

Figure 10:
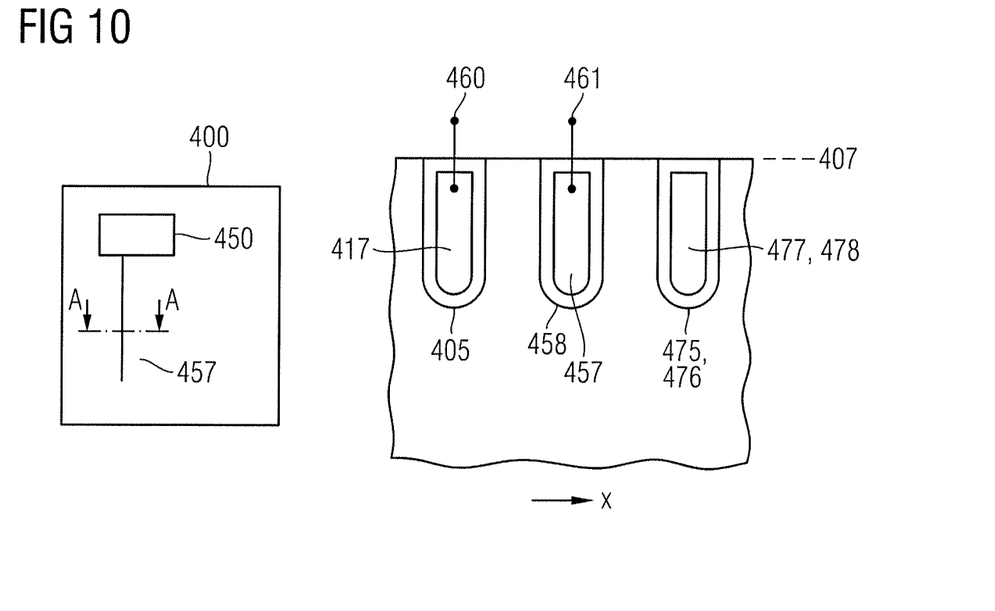
FIG. 10 is a schematic illustration of an integrated circuit including a sensor device, a sensor wiring in a sensor trench structure and an auxiliary trench structure.

An embodiment of an integrated circuit 400 is illustrated in FIG. 10. The integrated circuit 400 includes a sensor device 450 including a wiring 457 in a sensor trench structure 458 extending into a semiconductor body 402 from a first side 407.

The integrated circuit 400 further includes a first auxiliary trench structure 405 extending into the semiconductor body 402 from the first side 407. The sensor trench structure 458 and the first auxiliary trench structure 405 are arranged directly one after another along the lateral direction x. A first auxiliary electrode 417 in the first auxiliary trench structure 405 is electrically decoupled from the wiring 457 in the sensor trench structure 458. The first auxiliary electrode 417 may be electrically connected to a first auxiliary contact 460 electrically disconnected from a contact 461 connected to the wiring 457.

Embodiments of the first auxiliary trench structures and the gate trenches described above likewise apply to the first auxiliary trench structure and sensor trench structure of FIG. 10.

The integrated circuit 400 may further comprise a second auxiliary trench structure 475 extending into the semiconductor body 402 from the first side 407. A second auxiliary electrode 477 is arranged in the second auxiliary trench structure 475. The first auxiliary trench structure 405, the sensor trench structure 458 and the second auxiliary trench structure 475 are arranged directly one after another along the lateral direction x.

According to another embodiment, the second auxiliary trench structure 475 is replaced by a trench structure 476, e.g. a gate trench of a circuit element, e.g. a trench transistor cell array. The second auxiliary electrode 477 is replaced by an electrode 478 in the trench structure, e.g. a gate electrode. The first auxiliary trench structure 405, the sensor trench structure 458 and the circuit element are arranged directly one after another along the lateral direction x.

The wiring 457 may include one or more conductive materials, for example highly doped semiconductor material(s) such as highly doped polycrystalline silicon and/or metal(s).

FIGS. 11A to 11D are schematic cross-sectional views of a semiconductor body for illustrating an embodiment of forming the semiconductor device illustrated in FIG. 1.

Figure 11A:
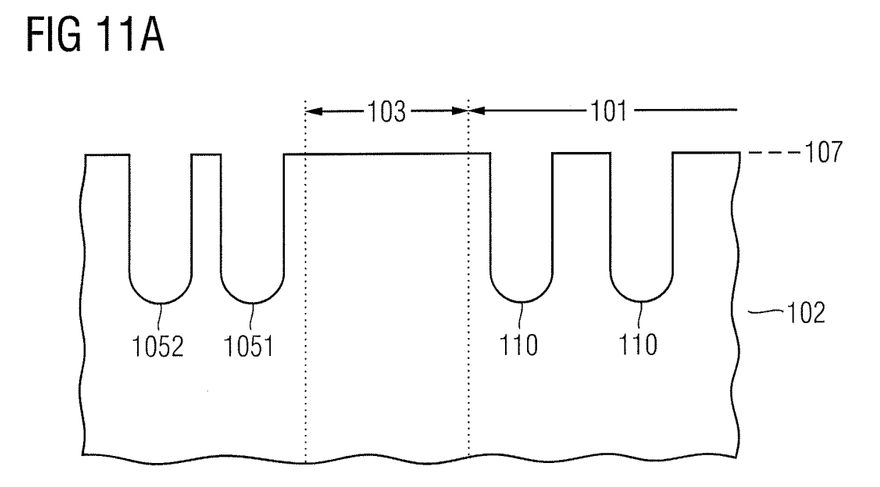
FIGS. 11A to 11D are schematic cross-sectional views of a semiconductor body for illustrating an embodiment of forming the semiconductor device illustrated in FIG. 1.

The schematic cross-sectional view of the semiconductor body 102 of FIG. 11A illustrates a process of forming the at least two first auxiliary trench structures 1051, 1052 and the gate trenches 110 in the trench transistor cell array 101 by an etch process, for example by a dry etch process such as an plasma etch process using a lithographically defined etch mask.

Figure 11B:
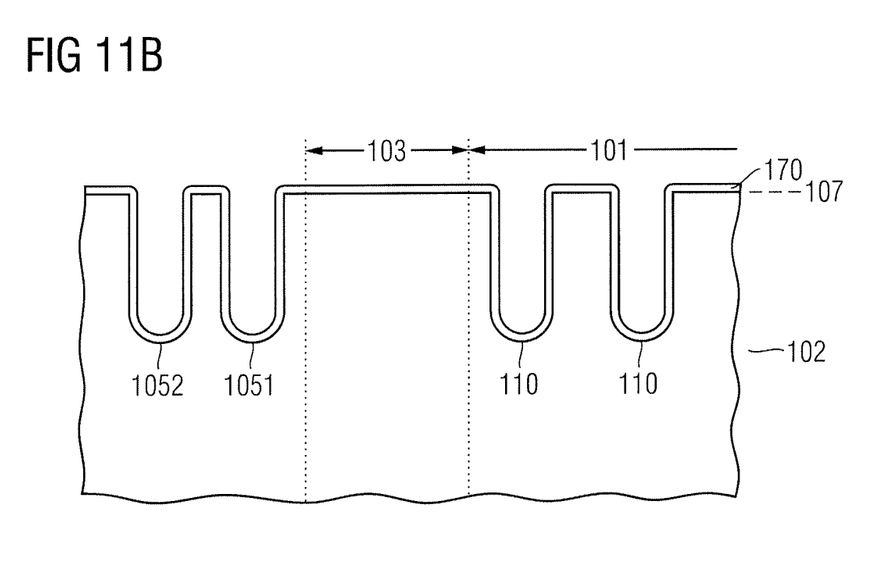

The schematic cross-sectional view of the semiconductor body 102 of FIG. 11B illustrates a process of forming a dielectric layer 170 lining the at least two first auxiliary trench structures 1051, 1052 and the gate trenches 110 in the trench transistor cell array 101. According to an embodiment, the dielectric layer 170 is formed by a dielectric layer deposition process having high conformity such as low pressure chemical vapor deposition (LPCVD), for example.

Figure 11C:
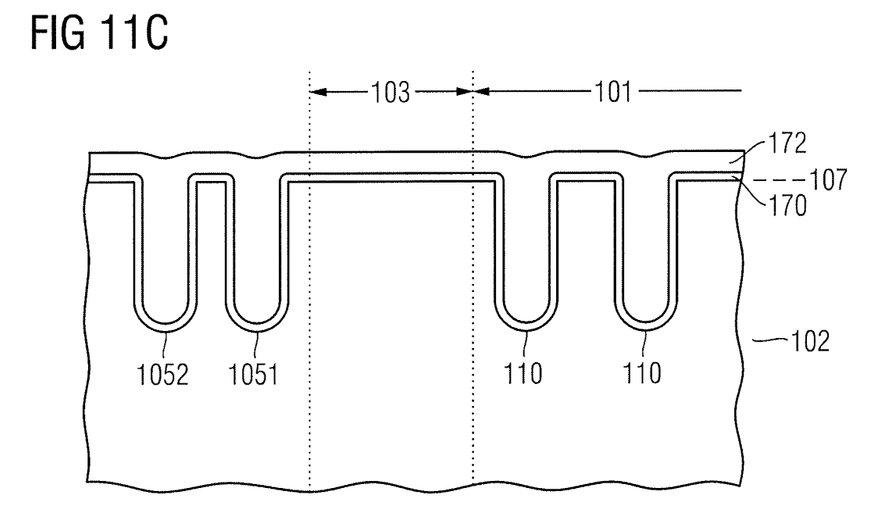

The schematic cross-sectional view of the semiconductor body 102 of FIG. 11C illustrates a process of forming an electrode material 172 in the at least two first auxiliary trench structures 1051, 1052 and the gate trenches 110 in the trench transistor cell array 101.

Figure 11D:
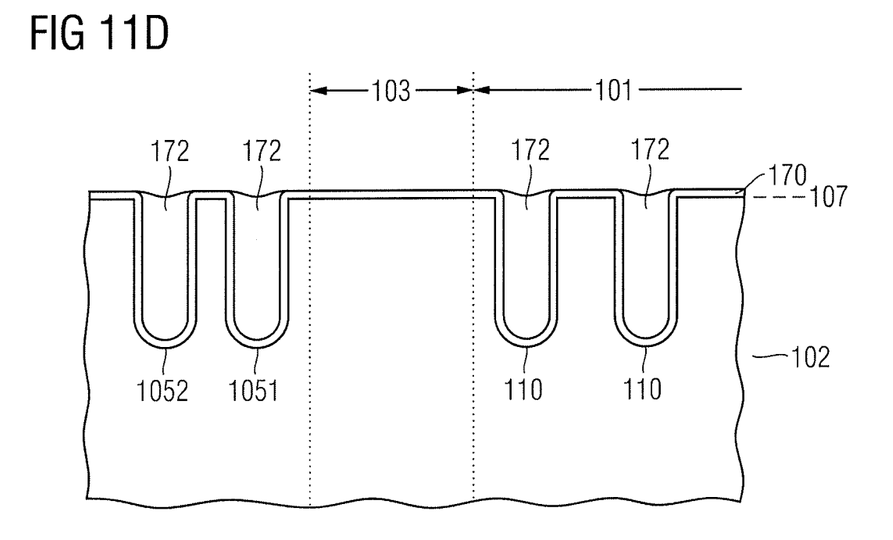

The schematic cross-sectional view of the semiconductor body 102 of FIG. 11D illustrates a process of chemical mechanical polishing of the electrode material 172 at the first side 107.

Further processes at the first side 107 will follow, for example front-end-of-line (FEOL) processes such as doping, patterning, etching for completing FEOL processing of a semiconductor device such as is illustrated in FIG. 1.

The second side of the semiconductor body 102 may, e.g., be attached on a carrier by gluing, soldering, or sintering. In case the semiconductor device 100 is attached by soldering, a soft solder or a diffusion solder may be used to attach the semiconductor device 100. The semiconductor body 102 may, e.g., be attached with the second side 110 on the carrier. The carrier may, e.g., be one of a lead frame, a ceramics substrate such as, e.g., a DCB (direct copper bonded) ceramics substrate, and a printed circuit board (PCB).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a trench transistor cell array in a semiconductor body,
   an edge termination region of the trench transistor cell array,
   at least two first auxiliary trench structures extending into the semiconductor body from a first side and being consecutively arranged along a lateral direction, wherein
   the edge termination region is arranged, along the lateral direction, between the trench transistor cell array and the at least two first auxiliary trench structures,
   first auxiliary electrodes in the at least two first auxiliary trench structures are electrically connected together and electrically decoupled from electrodes in trenches of the trench transistor cell array, wherein the first auxiliary electrodes are electrically connected to a drain contact of the trench transistor cell array, or to a substrate contact electrically connected to a semiconductor substrate of the semiconductor body, or to a contact at a second side of the semiconductor body opposite to the first side.

2. The semiconductor device of claim 1, wherein the trenches of the trench transistor cell array are gate electrode trenches, each one of the gate electrode trenches including a gate electrode and a gate dielectric.

3. The semiconductor device of claim 1, wherein each one of the at least two first auxiliary trench structures includes a single first auxiliary electrode.

4. The semiconductor device of claim 1, wherein each one of the at least two first auxiliary trench structures includes at least two first auxiliary electrodes.

5. The semiconductor device of claim 1, wherein an extension of the edge termination region along the lateral direction between the trench transistor cell array and the at least two first auxiliary trench structures ranges between 5 .mu.m and 500 .mu.m.

6. The semiconductor device of claim 5, further comprising, in the trench transistor cell array, source regions electrically connected to contacts through a surface of the semiconductor body at the first side, wherein the source regions and the contacts connected to the source regions are absent in a semiconductor region between the at least two first auxiliary trench structures.

7. The semiconductor device of claim 5, further comprising, in the trench transistor cell array, source regions electrically connected to contacts through a surface of the semiconductor body at the first side, wherein the source regions and the contacts connected to the source regions are absent in the edge termination region.

8. The semiconductor device of claim 5, wherein the edge termination region includes an edge termination trench structure, wherein a thickness of a dielectric in the edge termination trench structure is greater than a thickness of a gate dielectric of a gate trench structure in the trench transistor cell array at a vertical level of a center of a gate electrode in the gate trench structure.

9. The semiconductor device of claim 1, wherein a pitch between adjacent first auxiliary trench structures along the lateral direction equals a pitch between adjacent gate trench structures in the trench transistor cell array along the lateral direction.

10. The semiconductor device of claim 1, wherein a geometry of the at least two first auxiliary trench structures projected to a surface area of the semiconductor body at the first side equals a geometry between adjacent gate trench structures in the trench transistor cell array.

11. The semiconductor device of claim 1, wherein an area of the at least two first auxiliary trench structures projected to a surface area of the semiconductor body at the first side overlaps a contact pad area at the first side.

12. The semiconductor device of claim 1, wherein the at least two first auxiliary trench structures are arranged, along the lateral direction, between a first trench transistor cell array and a second trench transistor cell array.

13. The semiconductor device of claim 1, further comprising at least two second auxiliary trench structures extending into the semiconductor body from the first side and being consecutively arranged along the lateral direction, wherein
the at least two first auxiliary trench structures are arranged, along the lateral direction, between the at least two second auxiliary trench structures and the edge termination region; and
second auxiliary electrodes in the at least two second auxiliary trench structures are electrically connected together and electrically decoupled from electrodes in the trenches of the trench transistor cell array and from the first auxiliary electrodes in the at least two first auxiliary trench structures.

14. An integrated circuit, comprising:
a sensor device including a wiring in a sensor trench structure extending into a semiconductor body from a first side;
a first auxiliary trench structure nonadjacent to a source region and different from a gate trench structure of a transistor cell array and extends into the semiconductor body from the first side, the first auxiliary trench structure and the sensor trench structure being arranged directly one after another along a lateral direction, wherein
a first auxiliary electrode in the first auxiliary trench structure is electrically decoupled from the wiring in the sensor trench structure and electrically decoupled from electrodes in trenches of a trench transistor cell array, wherein the first auxiliary electrode is electrically connected to a drain contact of the trench transistor cell array, or to a substrate contact electrically connected to a semiconductor substrate of the semiconductor body, or to a contact at a second side of the semiconductor body opposite to the first side.

15. The integrated circuit of claim 14, further comprising a second auxiliary trench structure extending into the semiconductor body from the first side, the first auxiliary trench structure, the sensor trench structure and the second auxiliary trench structure being arranged directly one after another along the lateral direction.

16. The integrated circuit of claim 14, the first auxiliary trench structure, the sensor trench structure and a circuit element are arranged directly one after another along the lateral direction.

* * * * *